US007634695B2

(12) United States Patent
Doi

(10) Patent No.: US 7,634,695 B2
(45) Date of Patent: Dec. 15, 2009

(54) TEST APPARATUS AND SELECTION APPARATUS

(75) Inventor: Masaru Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 313 days.

(21) Appl. No.: 11/855,157

(22) Filed: Sep. 14, 2007

(65) Prior Publication Data

US 2008/0244340 A1 Oct. 2, 2008

Related U.S. Application Data

(63) Continuation of application No. PCT/JP2006/325418, filed on Dec. 20, 2006.

(30) Foreign Application Priority Data

Jan. 24, 2006 (JP) ............................ 2006-015627

(51) Int. Cl.
*G11C 29/00* (2006.01)
*G11C 16/04* (2006.01)

(52) U.S. Cl. .................. 714/711; 714/718; 365/185.33

(58) Field of Classification Search ................. 714/711, 714/718, 723, 704, 736, 37, 42, 47, 48, 53, 714/54; 365/200, 201, 185.33
See application file for complete search history.

(56) References Cited

U.S. PATENT DOCUMENTS 4,510,580 A * 4/1985 Yomogida et al. ........... 712/245
6,895,537 B2 * 5/2005 Kawagoe et al. ............ 714/710
7,206,237 B2 * 4/2007 Kim ........................... 365/201
7,243,273 B2 * 7/2007 Lin ............................ 714/718

FOREIGN PATENT DOCUMENTS

JP 2001-006388 1/2001
JP 2001-319493 11/2001
JP 2002-117699 4/2002

* cited by examiner

*Primary Examiner*—Phung M Chung
(74) *Attorney, Agent, or Firm*—Jianq Chyun IP Office

(57) ABSTRACT

There is provided a test apparatus for testing a memory under test that includes therein a plurality of blocks and one or more repairing columns. The test apparatus includes a testing section, a flag memory that stores thereon a flag indicating whether each column is defective, a counter memory that stores thereon the number of defective blocks in association with each column, a failure writing section that writes a flag indicating that a column is defective into the flag memory under a condition that one of the following conditions is satisfied: when a test result indicates that the column is defective; and when a flag stored on the flag memory in association with the column indicates that the column is defective, a counting section that increments the number of defective blocks stored on the counter memory in association with the column under a condition that the test result indicates that the column is defective and the flag indicating that the column is defective is not stored on the flag memory in association with the column, and a selecting section that selects columns to be replaced with the repairing columns based on the number of defective blocks stored in association with each column.

9 Claims, 9 Drawing Sheets

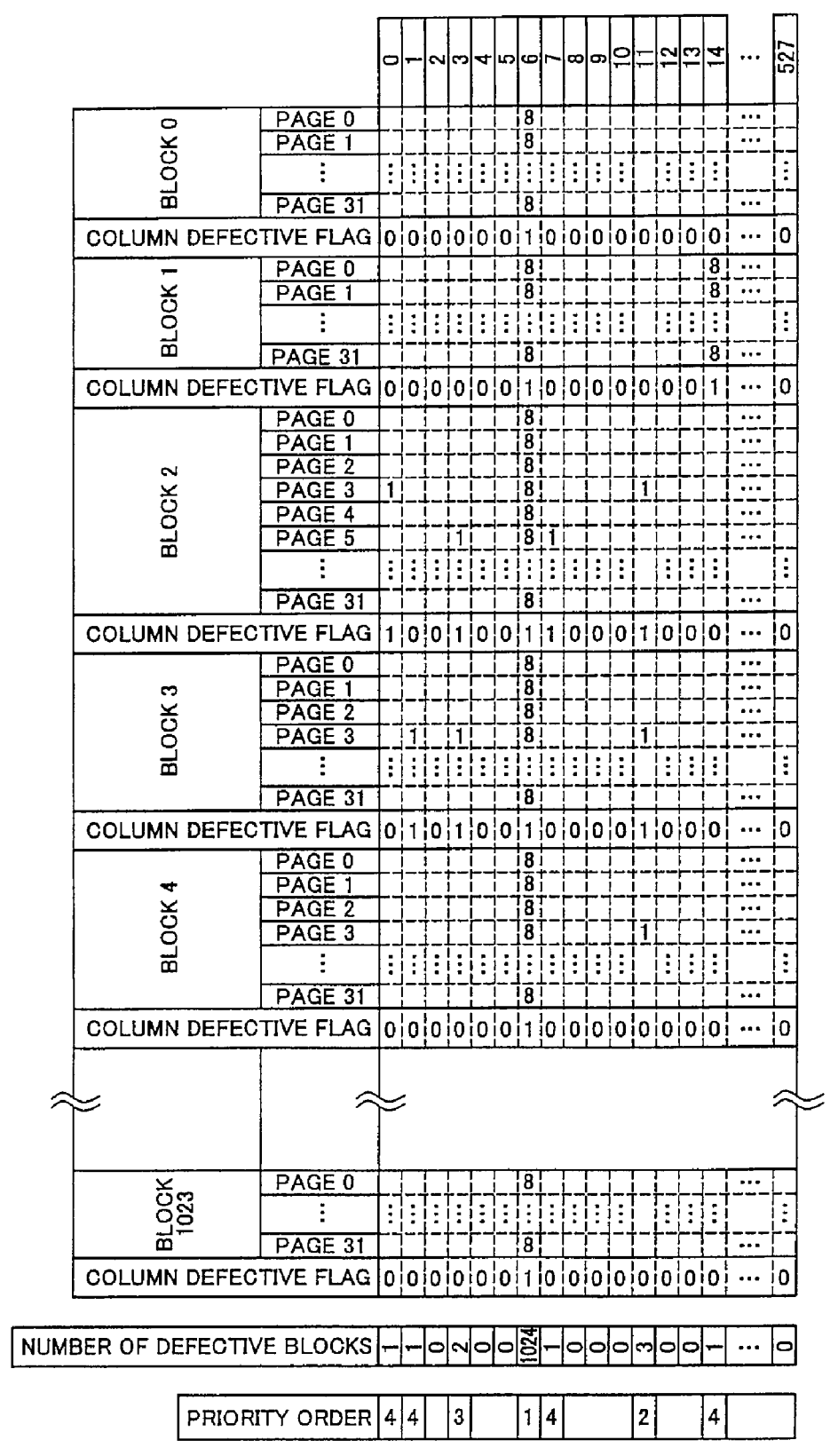

| | | 0 | 1 | 2 | 3 | 4 | 5 | 6 | 7 | 8 | 9 | 10 | 11 | 12 | 13 | 14 | … | 527 |
|---|---|---|---|---|---|---|---|---|---|---|---|---|---|---|---|---|---|---|
| BLOCK 0 | PAGE 0 | | | | | | | 8 | | | | | | | | | … | |
| | PAGE 1 | | | | | | | 8 | | | | | | | | | … | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | | ⋮ |
| | PAGE 31 | | | | | | | 8 | | | | | | | | | … | |
| COLUMN DEFECTIVE FLAG | | 0 | 0 | 0 | 0 | 0 | 0 | 1 | 0 | 0 | 0 | 0 | 0 | 0 | 0 | 0 | … | 0 |
| BLOCK 1 | PAGE 0 | | | | | | | 8 | | | | | | | | 8 | … | |
| | PAGE 1 | | | | | | | 8 | | | | | | | | 8 | … | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | | ⋮ |
| | PAGE 31 | | | | | | | 8 | | | | | | | | 8 | … | |
| COLUMN DEFECTIVE FLAG | | 0 | 0 | 0 | 0 | 0 | 0 | 1 | 0 | 0 | 0 | 0 | 0 | 0 | 0 | 1 | … | 0 |
| BLOCK 2 | PAGE 0 | | | | | | | 8 | | | | | | | | | … | |
| | PAGE 1 | | | | | | | 8 | | | | | | | | | … | |
| | PAGE 2 | | | | | | | 8 | | | | | | | | | … | |
| | PAGE 3 | 1 | | | | | | 8 | | | | | 1 | | | | … | |
| | PAGE 4 | | | | | | | 8 | | | | | | | | | … | |
| | PAGE 5 | | | | 1 | | | 8 | 1 | | | | | | | | … | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | | ⋮ |
| | PAGE 31 | | | | | | | 8 | | | | | | | | | … | |
| COLUMN DEFECTIVE FLAG | | 1 | 0 | 0 | 1 | 0 | 0 | 1 | 1 | 0 | 0 | 0 | 1 | 0 | 0 | 0 | … | 0 |
| BLOCK 3 | PAGE 0 | | | | | | | 8 | | | | | | | | | … | |
| | PAGE 1 | | | | | | | 8 | | | | | | | | | … | |
| | PAGE 2 | | | | | | | 8 | | | | | | | | | … | |
| | PAGE 3 | | 1 | | 1 | | | 8 | | | | | 1 | | | | … | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | | ⋮ |
| | PAGE 31 | | | | | | | 8 | | | | | | | | | … | |
| COLUMN DEFECTIVE FLAG | | 0 | 1 | 0 | 1 | 0 | 0 | 1 | 0 | 0 | 0 | 0 | 1 | 0 | 0 | 0 | … | 0 |
| BLOCK 4 | PAGE 0 | | | | | | | 8 | | | | | | | | | … | |
| | PAGE 1 | | | | | | | 8 | | | | | | | | | … | |
| | PAGE 2 | | | | | | | 8 | | | | | | | | | … | |
| | PAGE 3 | | | | | | | 8 | | | | | 1 | | | | … | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | | ⋮ |
| | PAGE 31 | | | | | | | 8 | | | | | | | | | … | |
| COLUMN DEFECTIVE FLAG | | 0 | 0 | 0 | 0 | 0 | 0 | 1 | 0 | 0 | 0 | 0 | 0 | 0 | 0 | 0 | … | 0 |
| ≈ | ≈ | ≈ | | | | | | | | | | | | | | | | ≈ |
| BLOCK 1023 | PAGE 0 | | | | | | | 8 | | | | | | | | | … | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | | ⋮ |
| | PAGE 31 | | | | | | | 8 | | | | | | | | | … | |
| COLUMN DEFECTIVE FLAG | | 0 | 0 | 0 | 0 | 0 | 0 | 1 | 0 | 0 | 0 | 0 | 0 | 0 | 0 | 0 | … | 0 |
| NUMBER OF DEFECTIVE BLOCKS | | 1 | 1 | 0 | 2 | 0 | 0 | 1024 | 1 | 0 | 0 | 0 | 3 | 0 | 0 | 1 | … | 0 |
| PRIORITY ORDER | | 4 | 4 | | 3 | | | 1 | 4 | | | | 2 | | | 4 | | |

FIG. 4

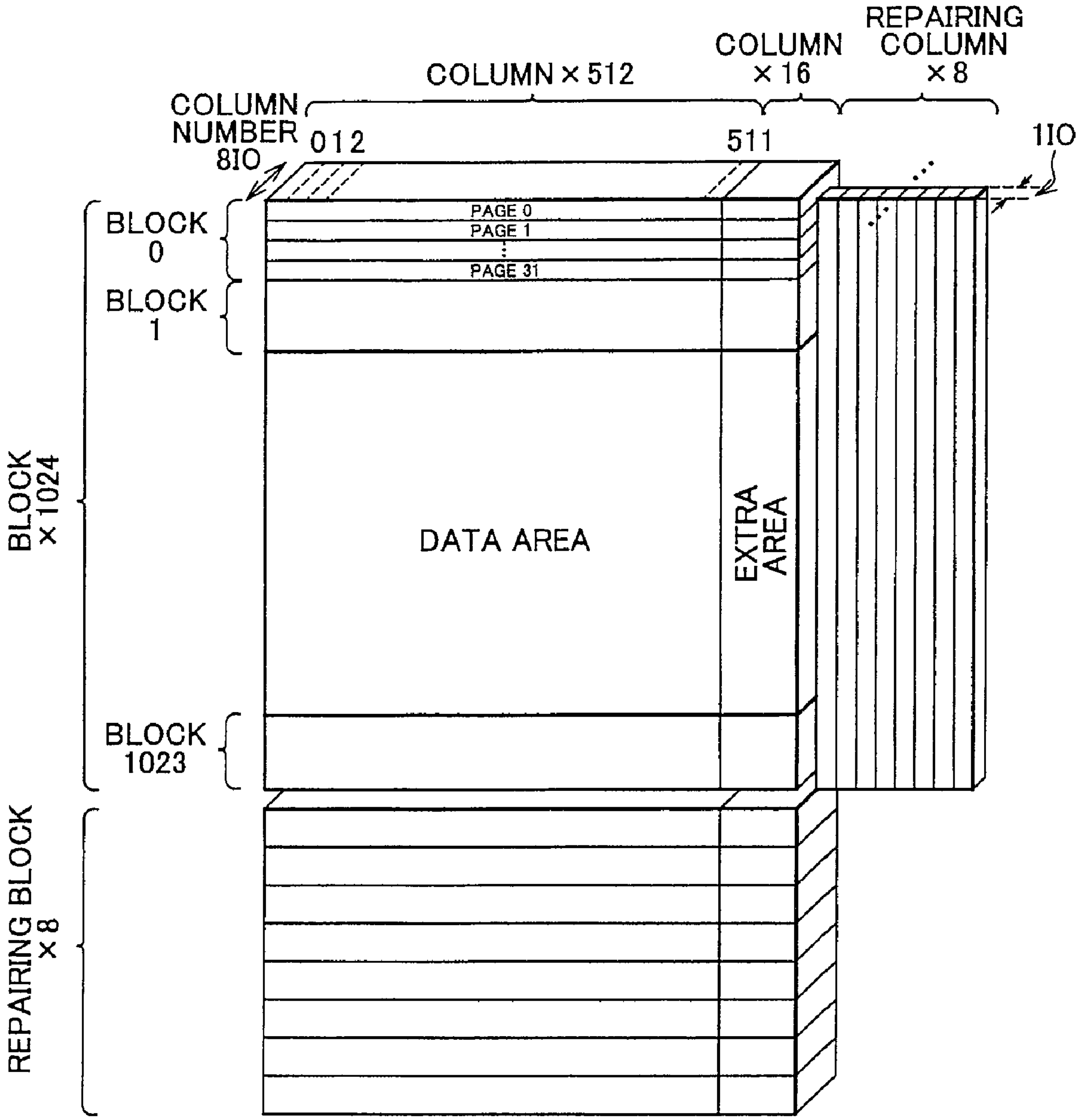
F I G . 7

TEST APPARATUS AND SELECTION APPARATUS

CROSS REFERENCE TO RELATED APPLICATION

This is a continuation application of PCT/JP2006/325418 filed on Dec. 20, 2006 which claims priority from a Japanese Patent Application(s) NO. 2006-015627 filed on Jan. 24, 2006, the contents of which are incorporated herein by reference.

BACKGROUND

1. Technical Field

The present invention relates to a test apparatus and a selection apparatus. More particularly, the present invention relates to a test apparatus for testing a memory under test including therein repairing columns that are provided so as to collectively replace columns, and to a selection apparatus for use in the test apparatus.

2. Related Art

A flash memory is known as a nonvolatile semiconductor memory. The flash memory is widely used in various types of information devices and the like. A typical memory device including therein a flash memory has an enormous number of storage cells, and the storage cells may contain some defective storage cells. In view of this, the memory device includes therein redundant storage cells which can replace the defective storage cells during a test process of the memory device. By replacing the defective storage cells with the redundant storage cells, the defective storage regions of the memory devices are saved. The operation of replacing the defective storage cells with the redundant storage cells is generally performed during the test process of the memory device, and is referred to as a memory repairing operation (or redundancy).

To perform the memory repairing operation, it is required to detect the positions of the defective storage cells and to conduct an analysis in order to determine in advance how to replace the detected defective storage cells with the redundant storage cells. This procedure is referred to as a memory repairing analysis and performed by a test apparatus.

Since no prior art documents have been found, such documents are not mentioned herein.

The test apparatus performs the memory repairing analysis in the following manner, for example. The test apparatus conducts a test on the memory under test to obtain failure information, and writes the obtained failure information into a failure memory. Subsequently, the test apparatus reads the failure information from the failure memory, and counts the number of errors. Since the test apparatus performs the memory repairing analysis by writing and reading the failure information as mentioned above, the memory repairing analysis is time consuming.

Here, the test apparatus can not perform different operations while performing the memory repairing analysis. Therefore, the time required for the memory repairing analysis is a dead time during the test process. Note that the capacity of the flash memory has been on the rise recently, and the test time is thus expected to increase. For the reasons stated above, it is desired to reduce the time necessary for the memory repairing analysis.

This need may be satisfied by a method which temporarily stores, on the failure memory, the failure information which has not been compressed and compresses the failure information in terms of the software. However, this method does not solve the problem that a long time is required to read the failure information.

SUMMARY

Therefore, it is an object of an aspect of the present invention to provide a test apparatus and a selection apparatus, which are capable of overcoming the above drawbacks accompanying the related art. The above and other objects can be achieved by combinations described in the independent claims. The dependent claims define further advantageous and exemplary combinations of the present invention.

According to an aspect related to the innovations herein, one exemplary test apparatus may include a test apparatus for testing a memory under test. Here, the memory under test includes therein (i) a plurality of blocks each of which has a plurality of columns and (ii) one or more repairing columns each of which is provided so as to collectively replace columns each of which is included in one of the plurality of blocks and associated with the same column position. The test apparatus includes a testing section that tests each of the plurality of blocks provided in the memory under test, and outputs information indicating whether a test target block is defective in units of the columns, a flag memory that stores thereon, in association with each of the plurality of columns in the test target block, a flag that indicates whether a corresponding one of the plurality of columns in the test target block is defective, a counter memory that stores thereon, in association with each of the plurality of columns, the number of defective blocks which is the number of blocks that have defects at a column position associated with a corresponding one of the plurality of columns, a failure writing section that receives, from the testing section, a test result of a test target column in the test target block, and writes a flag indicating that the test target column is defective into the flag memory under a condition that at least one of the following conditions is satisfied: when the received test result indicates that the test target column is defective; and when a flag that is stored on the flag memory in association with the test target column indicates that the test target column is defective, a counting section that receives, from the testing section, the test result of the test target column, and increments the number of defective blocks which is stored on the counter memory in association with the test target column under a condition that the received test result indicates that the test target column is defective and the flag indicating that the test target column is defective is not stored on the flag memory in association with the test target column, and a selecting section that selects columns to be replaced with the repairing columns based on the number of defective blocks which is stored on the counter memory in association with each of the plurality of columns.

According to an aspect related to the innovations herein, one exemplary selection apparatus may include a selection apparatus for use with a memory under test. Here, the memory under test includes therein (i) a plurality of blocks each of which has a plurality of columns and (ii) one or more repairing columns each of which is provided so as to collectively replace columns each of which is included in one of the plurality of blocks and associated with the same column position. The selection apparatus selects one or more column positions associated with the columns to be replaced with the repairing columns. The selection apparatus includes a flag memory that stores thereon, in association with each of the plurality of columns in a test target block which is tested, a flag indicating whether the each column in the test target block is defective, a counter memory that stores thereon, in association with each of the plurality of columns, the number of defective blocks which is the number of blocks that have defects at a column position associated with the each column, a failure writing section that receives a test result of a test target column of the test target block, and writes a flag indicating that the test target column is defective into the flag memory under a condition that at least one of the following conditions is satisfied: the received test result indicates that the test target column is defective; and a flag that is stored on the flag memory in association with the test target column indicates that the test target column is defective, a counting section that receives the test result of the test target column, and increments the number of defective blocks which is stored on the counter memory in association with the test target column under a condition that the received test result indicates that the test target column is defective and the flag indicating that the test target column is defective is not stored on the flag memory in association with the test target column, and a selecting section that selects the columns to be replaced with the repairing columns based on the number of defective blocks which is stored on the counter memory in association with each of the plurality of columns.

According to an aspect related to the innovations herein, one exemplary test apparatus may include a test apparatus for testing a memory under test which is a flash memory. Here, the memory under test includes therein (i) a storage region that is divided into a plurality of blocks and (ii) a plurality of repairing lines for a repairing operation. The test apparatus uses a result of the test to conduct an analysis for the repairing operation. The test apparatus includes a testing section that supplies a test signal to the memory under test, and outputs, as failure information, a result of comparing read data which is output from the memory under test in response to the test signal with an expected value, and an analyzing section that generates analysis information for the repairing operation while the testing section tests the memory under test. Here, the analyzing section includes a flag memory that stores thereon, in response to an address signal corresponding to an address on the memory under test which is accessed by the testing section, flag information which is obtained by accumulating pieces of failure information output from the testing section, in association with each of memory regions which are obtained by dividing the plurality of blocks in the memory under test in correspondence with the plurality of repairing lines, and a counter memory that stores thereon, in response to the address signal corresponding to the address on the memory under test which is accessed by the testing section, a result of counting the number of the pieces of failure information output from the testing section, in association with each of the plurality of repairing lines provided in the memory under test.

The summary clause does not necessarily describe all necessary features of the embodiment of the present invention. The present invention may also be a sub-combination of the features described above. The above and other features and advantages of the present invention will become more apparent from the following description of the embodiment taken in conjunction with the accompanying drawings.

BRIEF DESCRIPTION OF THE DRAWINGS

FIG. 4 illustrates flags which are stored on a flag memory 31 and the numbers of defective blocks which are stored on a counter memory 32 as a result of a test performed on the memory under test 100 which has a defective storage cell pattern illustrated in FIG. 2.

FIG. 7 illustrates an example of the memory under test 100 which includes therein repairing columns each of which corresponds to one storage cell in a given column.

DESCRIPTION OF EXEMPLARY EMBODIMENT

Hereinafter, an aspect of the present invention will be described through an embodiment. The embodiment does not limit the invention according to the claims, and all the combinations of the features described in the embodiment are not necessarily essential to means provided by aspects of the invention.

Figure 1:
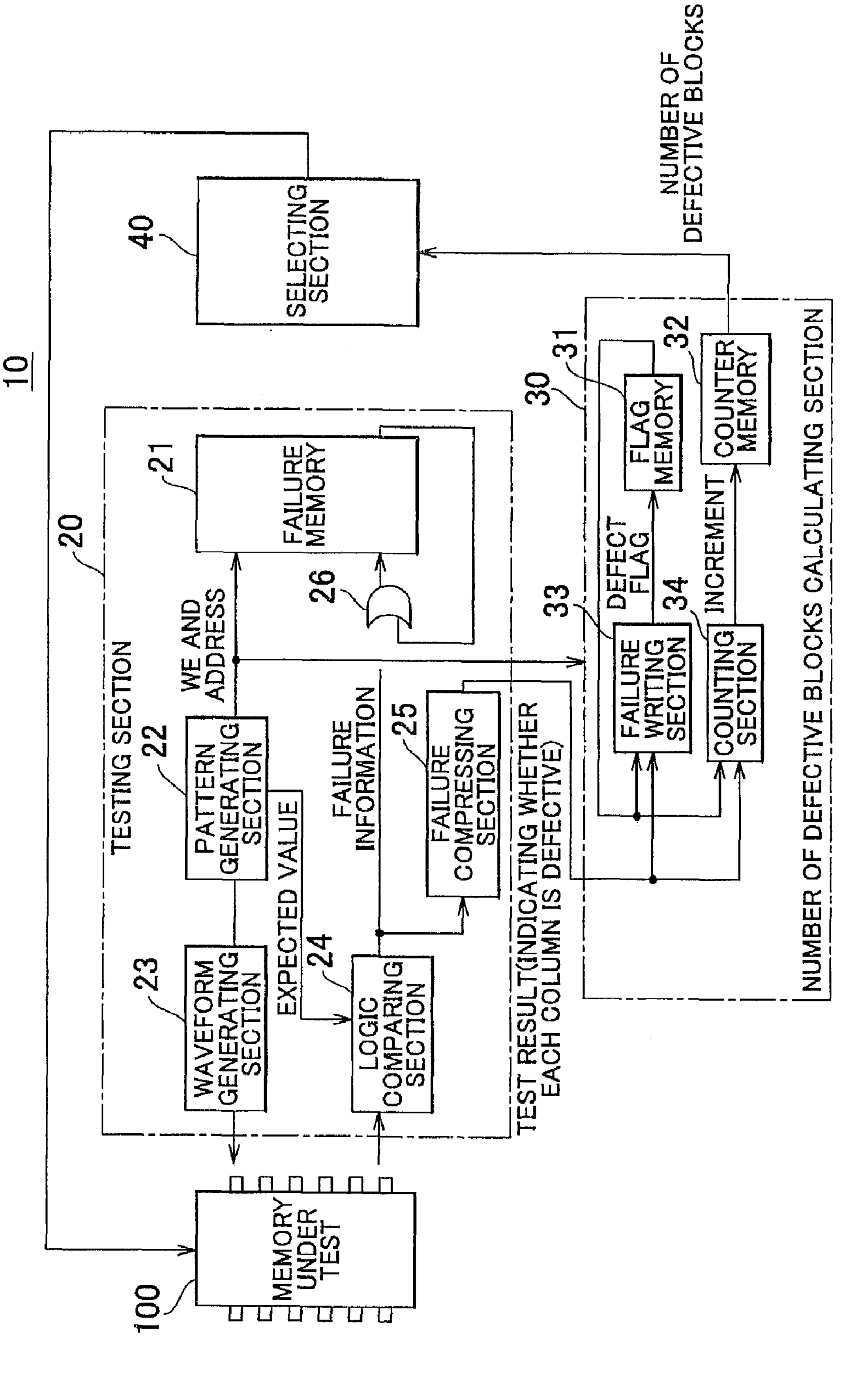
FIG. 1 illustrates the configuration of a test apparatus 10 relating to an embodiment of the present invention, together with a memory under test 100.

FIG. 1 illustrates the configuration of a test apparatus 10 relating to the present embodiment, together with a memory under test 100. The test apparatus 10 tests the memory under test 100 which is a flash memory, for example. The memory under test 100 includes therein a plurality of blocks each of which has a plurality of columns, and one or more repairing columns each of which is provided so as to collectively replace a group of columns each of which is included in one of the plurality of blocks and associated with the same column position.

The test apparatus 10 includes therein a testing section 20, a number of defective blocks calculating section 30, and a selecting section 40. The testing section 20 tests each of the blocks of the memory under test 100, and outputs information indicating whether each of the columns included in a test target block is defective. The testing section 20 includes therein, for example, a failure memory 21, a pattern generating section 22, a waveform generating section 23, a logic comparing section 24, a failure compressing section 25, and a logical OR section 26. The failure memory 21 stores thereon failure information indicating whether each storage cell of the memory under test 100 is defective. Alternatively, the failure memory 21 may store thereon information which is obtained by compressing the failure information indicating whether each storage cell is defective. Which is to say, the failure memory 21 may store thereon failure information indicating whether each I/O is defective, or whether each column is defective, for example.

The pattern generating unit 22 generates a test pattern of a test signal to be supplied to the memory under test 100, an expected value of the output signal which is expected to be output from the memory under test 100 in response to the test signal supplied thereto, and an address in the memory under test 100 of a test target storage cell. The waveform generating section 23 generates the test signal based on the test pattern, and supplies the generated test signal to the memory under test 100.

The logic comparing section 24 compares the logic value of the output signal output from the memory under test 100 with the expected value in units of a bit, to judge whether a storage cell corresponding to each bit is defective. The logic comparing section 24 writes, via the logical OR section 26, failure information each bit of which indicates whether a storage cell is defective, onto the failure memory 21, in such a manner that each bit of the failure information is written at a location which is determined by the address generated by the pattern generating section 22. The failure compressing section 25 compresses the failure information which is output from the logic comparing section 24 and each bit of which indicates whether a storage cell is defective, into flags each of which indicates whether a column is defective. This compression is achieved by a logical OR operation, for example. The failure compressing section 25 outputs the flags as test results. The logical OR section 26 obtains a logical OR between the failure information output from the logic comparing section 24 and failure information which is read from a location on the failure memory 21 at which the writing is to be performed. In this way, when a plurality of tests are performed on the memory under test 100 and a particular bit location is detected to be defective in at least one of the tests, the logical OR section 26 can set the value, on the failure memory 21, which corresponds to the particular bit location so as to indicate that the particular bit location is defective.

The number of defective blocks calculating section 30 obtains the test results output from the testing section 20, each of which indicates whether a column in the memory under test 100 is defective, and uses the obtained test results in order to calculate the number of defective blocks in association with each of the columns of the memory under test 100. The number of defective blocks calculating section 30 may calculate the number of defective blocks while the testing section 20 performs the test on the memory under test 100.

To be more specific, the number of defective blocks calculating section 30 includes therein a flag memory 31, a counter memory 32, a failure writing section 33, and a counting section 34. The flag memory 31 stores thereon flags in a one-to-one correspondence with a plurality of columns included in a test target block which is a block to be tested in the memory under test 100. Here, each of the flags indicates whether a corresponding one of the columns in the test target block is defective. The counter memory 32 stores thereon, in association with each of the plurality of columns of the memory under test 100, the number of blocks each of which have defects in the column associated with the corresponding column number.

The failure writing section 33 receives, from the testing section 20, the test result of a test target column in a test target block. The failure writing section 33 writes a flag indicating that the test target column is defective into the flag memory 31, under the condition that at least one of the following conditions is satisfied: the received test result indicates that the test target column is defective; and the flag which is stored on the flag memory 31 in association with the test target column indicates that the test target column is defective. With such a configuration, the failure writing section 33 can store, onto the flag memory 31, flags which respectively indicate whether the plurality of columns of the test target block are defective.

The counting section 34 receives the test result of the test target column from the testing section 20. Under the condition that the received test result indicates that the test target column is defective and that the flag memory 31 does not store thereon, in association with the test target column, a flag which indicates that the test target column is defective, the counting section 34 increments the number of blocks which is stored on the counter memory 32 in association with the test target column. With such a configuration, the counting section 34 can achieve such a state that the counter memory 32 stores thereon the number of defective blocks in association with each of the plurality of columns of the memory under test 100, when the test apparatus 10 completes testing all of the blocks of the memory under test 100.

The selecting section 40 selects columns which are to be replaced with the repairing columns, based on the number of defective blocks which is stored on the counter memory 32 in association with each column. When making the selection of the columns to be replaced with the repairing columns, the selecting section 40 may give priority to columns corresponding to a column position which is associated with a larger number of defective blocks. For example, the selecting section 40 may determine the priority order among the columns based on the number of defective blocks which is stored on the counter memory 32 in association with each column, and select the columns to be replaced with the repairing columns starting from the columns which are given the highest priority in the determined priority order. The selecting section 40 subsequently replaces the selected columns with the repairing columns, for example, by writing the relations between the selected columns and the repairing columns onto a predetermined storage region in the memory under test 100.

As described above, the test apparatus 10 calculates the number of defective blocks in association with each column of the memory under test 100 independently from its operation of writing the information onto the failure memory 21, and selects the columns to be replaced with the repairing columns based on the calculated numbers of defective blocks. With such a configuration, the test apparatus 10 can efficiently select the columns to be replaced with the repairing columns within a short time period without the need of reading the failure information from the failure memory 21. Having this configuration, the test apparatus 10 can write the failure information which has not been compressed onto the failure memory 21. As a result, the test apparatus 10 can use the failure information stored on the failure memory 21 for generating distribution data indicating the physical positions of the defects, for example.

Figure 2:
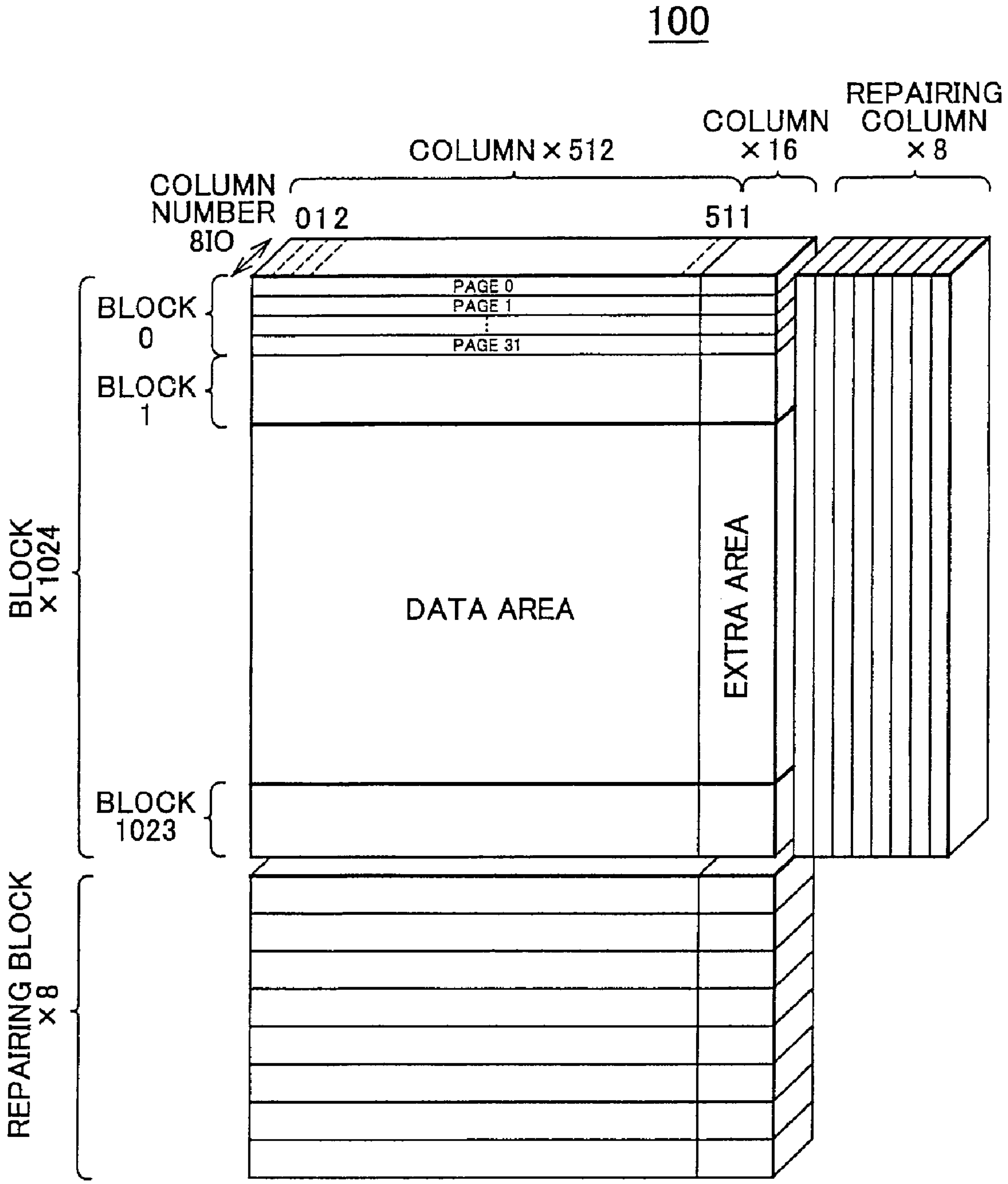
FIG. 2 illustrates an exemplary configuration of the memory under test 100.

FIG. 2 illustrates an exemplary configuration of the memory under test 100. The memory under test 100 may be a flash memory including therein a plurality of blocks each of which has a plurality of pages, a plurality of repairing columns, and a plurality of repairing blocks. The blocks are respectively assigned block numbers indicating their locations. The pages are used as the unit of data writing and data reading. The pages are respectively assigned page numbers indicating their locations in each block.

Each page has a plurality of columns. Here, note that each page has the same number of columns. The columns included in each page are respectively assigned unique column numbers. The column numbers are assigned in the same manner in all of the pages in all of the blocks. Therefore, it is possible to identify columns associated with the same column position in all the pages in all the blocks by identifying a column number.

Here, each page is divided into a data area for storing thereon user data and an extra area for storing thereon management data and the like. One column in one page has storage cells of a predetermined number of bits, and the storage cells perform input/output in parallel with each other by using a plurality of I/O pins.

The repairing columns are provided to be used as alternative storage regions to columns which have defective storage cells. The repairing columns each have I/Os corresponding to a group of columns each of which is included in one of the pages of the blocks of the memory under test 100 and associated with the same column position. When the test apparatus 10 performs a repairing operation, each repairing column collectively replaces the columns which all correspond to the same column position and each of which is included in one of the pages of the blocks.

The repairing blocks are provided to be used as alternative storage regions to blocks which include defective storage cells. The repairing blocks have substantially the same configuration as the blocks. When the test apparatus 10 performs the repairing operation, each repairing block replaces any one block. When the repairing operation is performed on the memory under test 100 as described above, the memory under test 100 can be used as an acceptable memory device.

Figure 3:
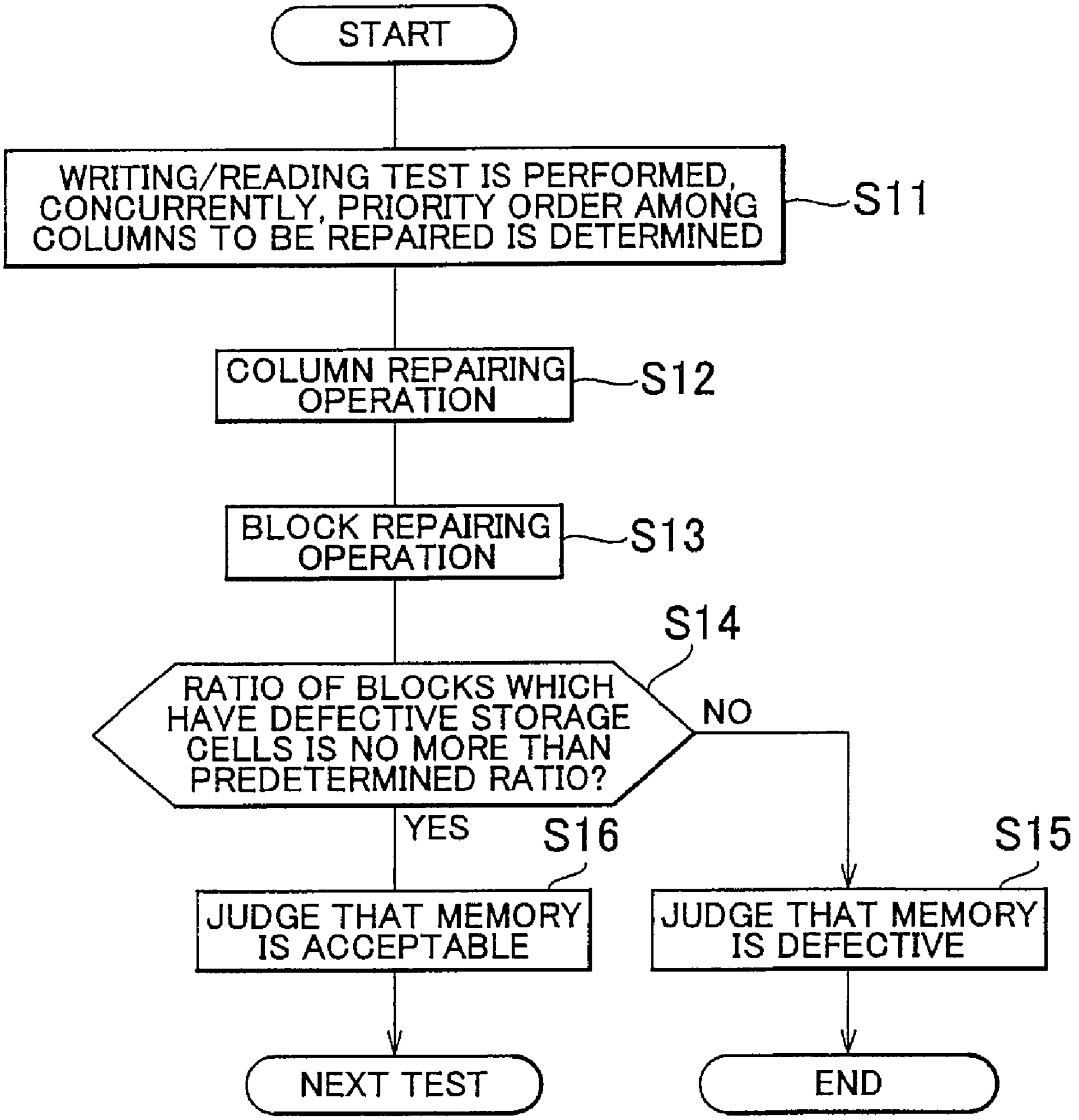
FIG. 3 illustrates a flow of the steps included in a test to be performed by the test apparatus 10 relating to the embodiment of the present invention on the memory under test 100 illustrated in FIG. 2.

FIG. 3 illustrates the flow of the steps included in the test which is performed by the test apparatus 10 relating to the present embodiment on the memory under test 100 illustrated in FIG. 2. To start with, in a step S11, the testing section 20 reads data which has been written into the memory under test 100, and compares the read data with an expected value in order to judge whether each storage cell is defective. The testing section 20 stores the judgment results onto the failure memory 21 as the failure information for the memory under test 100. Also in the step S11, the number of defective blocks calculating section 30 calculates the number of defective blocks in association with each column. Here, the number of defective blocks calculating section 30 may calculate the number of defective blocks in association with each column, while the testing section 20 performs the reading test. Subsequently, the selecting section 40 selects the columns to be replaced with the repairing columns based on the number of defective blocks which is calculated by the numbers of defective blocks calculating section 30.

After this, in a step S12, the selecting section 40 performs an operation to replace the columns selected in the step S11 with the repairing columns (a column repairing operation). For example, the selecting section 40 performs the column repairing operation by writing information related to the column repairing onto a predetermined storage region in the memory under test 100. After the column repairing operation is performed on the memory under test 100, when an access is made by a user's device to a column number corresponding to the columns on which the column repairing operation has been performed, the requested data writing, reading or erasing operation is performed on a corresponding repairing column, in place of the columns of the accessed column number.

After this, in a step S13, the selecting section 40 detects a block which has a defective storage cell in a column other than the columns which have been replaced by means of the column repairing operation, and performs an operation to replace the detected block with a repairing block (a block repairing operation). For example, the selecting section 40 performs the block repairing operation by writing information related to the block repairing onto a predetermined storage region. After the block repairing operation is performed on the memory under test 100, when an access is made by the user's device to the block number of the block on which the block repairing operation is performed, the requested data writing, reading or erasing operation is performed on the repairing column, in place of the block corresponding to the accessed block number.

It should be noted here that the selecting section 40 can save a plurality of blocks which include defective storage cells by performing the column repairing operation. The selecting section 40 performs the column repairing operation prior to the block repairing operation, for the purpose of reducing the number of blocks to be replaced with the repairing blocks.

After this, in a step S14, the selecting section 40 judges, after performing the block repairing operation, whether the ratio of the number of blocks which still have defective storage cells against the number of all the blocks in the memory under test 100 is no more than a predetermined ratio (for example, such a ratio that the remaining defective storage cells can be saved by a different method). When judging that the ratio is higher than the predetermined ratio (step S14:NO), the selecting section 40 subsequently judges in a step S15 that the memory under test 100 is defective. When judging that the ratio is no more than the predetermined ratio (step S14:YES), the selecting section 40 subsequently judges in a step S16 that the memory under test 100 is acceptable.

By performing the above-described steps S11 to S16, the test apparatus 10 can perform the column repairing operation and block repairing operation on the memory under test 100 which has defective storage cells, and judge whether the memory under test 100 is defective or acceptable taking into consideration the results of the column repairing operation and block repairing operation. In addition, the test apparatus 10 can select the columns on which the column repairing operation is to be performed while performing the reading test, thereby shortening the test time.

When making the positive judgment in the step S16, the test apparatus 10 may again perform the procedure including the above-described steps S11 to S16 at the time of a new writing/reading test which tests the memory under test 100 in terms of different or same points. In this way, the test apparatus 10 can also save defective storage cells which are newly detected by the new reading test, by performing the column repairing operation and block repairing operation.

FIG. 4 illustrates the flags which are stored on the flag memory 31 and the numbers of defective blocks which are stored on the counter memory 32 as a result of the test performed on the memory under test 100 which has a defective storage cell pattern illustrated in FIG. 2. In FIG. 4, the column numbers are arranged in the horizontal direction, and the block numbers and the page numbers are arranged in the vertical direction. The numbers which appear at the intersections of the page numbers and the column numbers each denote the number of defective storage cells corresponding to the intersection.

The flag memory 31 stores thereon flags (referred to as the column defective flags in FIG. 4) in a one-to-one correspondence with the columns of each block. Each of the flags indicates that the corresponding column is defective, when the column includes at least one defective storage cell. Take an example of the column No. 0 in the exemplary defective storage cell pattern shown in FIG. 4. Since one of the storage cells included in the I/Os belonging to the column No. 0 is defective in the page No. 3 of the block No. 2, the value of the column defective flag stored on the flag memory 31 in association with the column No. 0 of the block No. 2 is set at "1".

The counter memory 32 stores thereon the number of blocks which have defects in association with each column.

To be more specific, the counter memory 32 stores thereon, as the number of blocks which have defects, the sum of the values shown by the column defective flags, which are associated with the same column number, for all the blocks. For example, the counter memory 32 stores thereon the value "1" as the number of defective blocks in association with the column No. 0 in the exemplary defective storage cell pattern shown in FIG. 4.

According to the present embodiment, the counter memory 32 stores thereon the number of defective blocks in association with each column number defined in the memory under test 100. Such a configuration enables the selecting section 40 to calculate the priority order by comparing the numbers of defective blocks which are stored on the counter memory 32. As a result, the selecting section 40 can select the columns to be replaced with the repairing columns only by performing a very simple operation.

Figure 5:
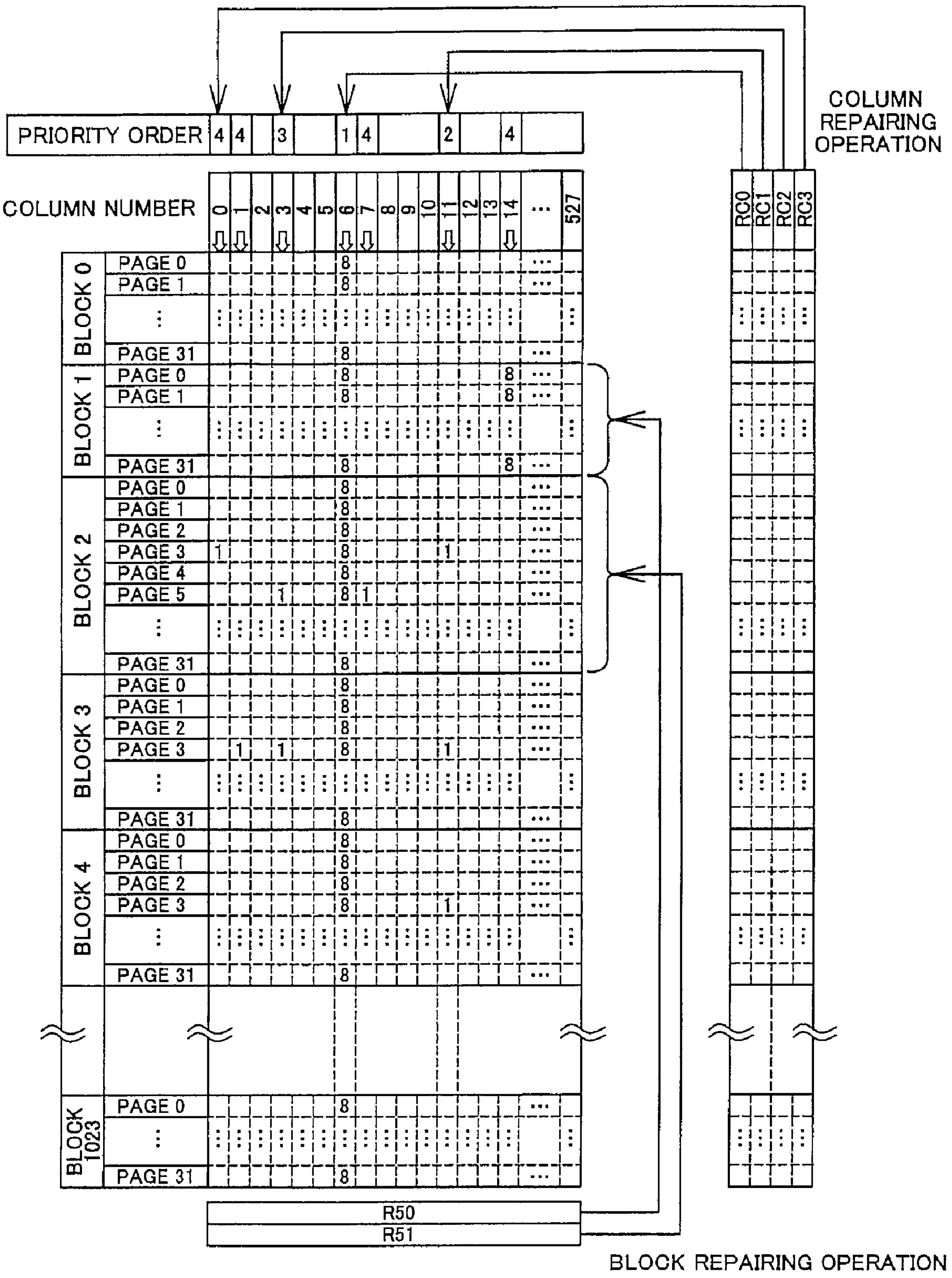
FIG. 5 illustrates, as an example, a defective storage cell pattern of the memory under test 100 shown in FIG. 4, and a column repairing operation and a block repairing operation performed when the memory under test 100 has the defective storage cell pattern.

FIG. 5 illustrates, as an example, the pattern of the defective storage cells included in the memory under test 100 shown in FIG. 4, and the column repairing operation and the block repairing operation which are to be performed in the case of the defective storage cell pattern shown in FIG. 4. According to the exemplary operations shown in FIG. 5, the number of repairing columns is four and the number of repairing blocks is two.

After the test apparatus 10 completes the reading test on the memory under test 100 and the detection of the defective storage cells, the selecting section 40 performs the column repairing operation. Referring to the column repairing operation, when the number of the columns including defective storage cells is larger than the number of the repairing columns provided in the memory under test 100, the selecting section 40 can not replace all of the columns which include defective storage cells with the repairing columns. Therefore, the selecting section 40 calculates the priority order for the column replacement operation among the columns which include defective storage cells, based on the numbers of defective blocks, and selects the columns to be replaced in accordance with the calculated priority order, starting from the column given the highest priority.

For example, while the number of repairing columns is four, the number of columns which include defective storage cells is seven in the exemplary defective storage cell pattern shown in FIG. 5. The selecting section 40 selects, from the seven defective columns, columns the number of which is, at most, equal to the number of the repairing columns (in the present example, four columns) starting from the column attached with the highest priority, and then performs the column repairing operation.

When performing the block repairing operation after the column repairing operation, the selecting section 40 preferably determines the priority order in such a manner that the column repairing operation leaves as few defective blocks as possible. In this case, the determination of the priority order is influenced not by the number of defective storage cells in each column within a block, but by the number of defective blocks which is associated with each column. In other words, the priority order is determined based on how many defective blocks can be saved by replacing a particular column with one of the repairing columns. Therefore, the selecting section 40 determines the priority order in accordance with the number of defective blocks which is stored on the counter memory 32 in association with each column in such a manner that the larger the number of the defective blocks is, the higher priority is given.

Referring to the exemplary defective storage cell pattern shown in FIG. 5, the selecting section 40 gives priority in the order of the column No. 6, column No. 11, column No. 3, . . . , in the descending order of the numbers of defective blocks. When more than one column have the same number of defective blocks (in the example shown in FIG. 5, the columns No. 0, No. 1 and No. 7 have the same number of defective blocks), the selecting section 40 may determine the priority order among these columns in accordance with a different criteria. For example, the selecting section 40 may give priority in the order of the column numbers. If this is the case, the selecting section 40 first determines the priority order in such a manner that the larger the number of defective blocks is, the higher priority is given, and, when more than one column have the same number of defective blocks, determines the priority order in such a manner that the smaller the column number is, the higher priority is given. As a result, the selecting section 40 gives priority in the order of the column No. 6, column No. 11, column No. 3, column No. 0, column No. 1, column No. 7, . . . .

After completing the column repairing operation, the selecting section 40 subsequently performs the block repairing operation. By performing the block repairing operation, the selecting section 40 replaces, with the repairing blocks, one or more blocks which include defective storage cells in columns other than the columns which have been replaced with the repairing columns by the column repairing operation. Referring to the block repairing operation, there may be also a case where the number of blocks which have defective storage cells is larger than the number of the repairing blocks provided in the memory under test 100. Therefore, the selecting section 40 may also determine the priority order for the block replacement operation among the blocks which have defective storage cells in columns other than the columns which have been replaced with the repairing columns by the column repairing operation, and select one or more blocks to be replaced in accordance with the determined priority order starting from the block given the highest priority.

According to the exemplary defective storage cell pattern shown in FIG. 5, the blocks No. 1, No. 2 and No. 3 still have defective storage cells after the column repairing operation is completed. For example, the selecting section 40 gives priority in the order of the block numbers. In this case, the selecting section 40 performs the block repairing operation on the blocks No. 1 and No. 2.

After completing the block repairing operation, the selecting section 40 counts the number of defective blocks. When the ratio between the number of defective blocks and the number of all the blocks is equal to or less than a predetermined ratio, the selecting section 40 judges that the memory under test 100 is acceptable. When the ratio is higher than the predetermined ratio, the selecting section 40 judges that the memory under test 100 is defective.

Figure 6:
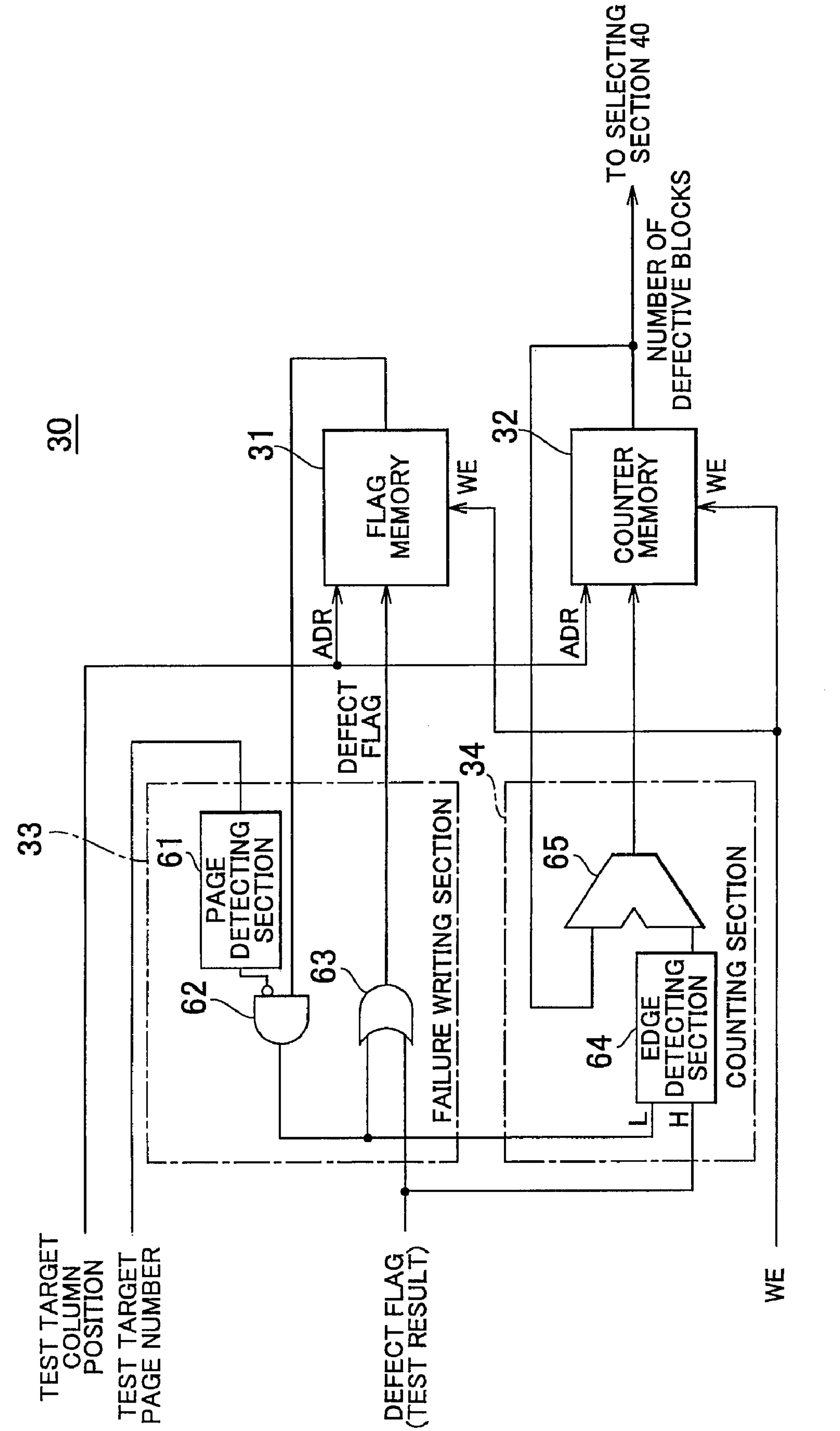
FIG. 6 illustrates an exemplary configuration of a number of defective blocks calculating section 30 relating to the embodiment of the present invention.

FIG. 6 illustrates an exemplary configuration of the number of defective blocks calculating section 30. According to the present example, the testing section 20 tests the respective pages one by one in each of the blocks provided in the memory under test 100. As a result of the tests, the testing section 20 outputs information indicating whether each of the columns included in the tested page is defective. Here, the testing section 20 may output a test result indicating the "H logic" when the column is defective and indicating the "L logic" when the column is acceptable. The testing section 20 may additionally output a test target column position indicating the position of the column in the test target block corresponding to the test result and a test target page position indicating the position of the page in the test target block corresponding to the test result.

In addition, the testing section 20 relating to the present example sequentially tests the respective blocks one by one, and outputs information indicating whether each of the columns in the test target block is defective. Which is to say, after completing the tests performed on all the columns of the all the pages in one block, the testing section 20 tests the next block. Also, the testing section 20 performs the tests on the blocks so as not to test one block twice or more. Here, the testing section 20 may output a write enable (WE) which indicates that the writing/reading test is being performed on the memory under test 100.

The flag memory 31 stores thereon flags (for example, 1-bit data) the number of which is equal to, at least, the number of the columns provided in the memory under test 100. Since the testing section 20 sequentially tests the respective blocks one by one, the failure writing section 33 writes, into the flag memory 31, the results of testing each column in association with the plurality of blocks. Here, the flag memory 31 stores thereon the flags associated with the respective columns in the test target block, in a storage region which is commonly used for the plurality of blocks. With such a configuration, the flag memory 31 is not required to have storage regions in a one-to-one correspondence with the plurality of blocks.

The counter memory 32 stores thereon data values the number of which is equal to, at least, the number of columns provided in the memory under test 100. To be more specific, the data values stored on the counter memory 32 each have words the number of which is capable of expressing, at least, the number of blocks provided in the memory under test 100. With such a configuration, the counter memory 32 can express the number of defective blocks which is associated with each of the columns provided in the memory under test 100 by using the data values stored thereon.

The flag memory 31 and the counter memory 32 may respectively permit the failure writing section 33 and the counting section 34 to perform writing, in accordance with the write enable (WE). With such a configuration, the number of defective blocks calculating section 30 can operate in parallel with the testing section 20.

The failure writing section 33 may write a flag indicating that the test target column in the test target block is defective into the flag memory 31 at an address which is identified by the position of the test target column. Also, the failure writing section 33 may read the flag stored on the flag memory 31, from the address on the flag memory 31 which is identified by the test target column. With such a configuration, the failure writing section 33 can receive the test result of the test target column in the test target block from the testing section 20, and write a flag indicating that the test target column is defective into the flag memory 31 when at least one of the following conditions is satisfied: the received test result indicates that the test target column is defective; and the flag which is stored on the flag memory 31 in association with the test target column indicates that the test target column is defective.

Furthermore, under the condition that the failure writing section 33 has received a test result of a test target column in the initial test target page of the test target block, the failure writing section 33 may write a flag indicating the received test result into the flag memory 31. With such a configuration, when the respective blocks are sequentially tested one by one, the failure writing section 33 can write a flag into the flag memory 31 under the condition that the test target block is updated. As a result, the failure writing section 33 having the above-mentioned configuration enables the storage region of the flag memory 31 to be commonly used for the plurality of blocks.

When testing the respective blocks one by one, the testing section 20 may sequentially test the plurality of pages of the test target block starting from the page with the smallest page number, and output information indicating whether each of the columns of the test target page is defective. In this case, under the condition that the failure writing section 33 has received the test result of the test target column in the page with the smallest page number in the test target block, the failure writing section 33 may write the flag indicating the received test result onto the flag memory 31. With such a configuration, when the respective blocks are sequentially tested one by one, the failure writing section 33 can write flags into the flag memory 31, starting from flags associated with the initial page of the test target block. As a result, the failure writing section 33 having the above-described configuration enables the storage region of the flag memory 31 to be commonly used for the plurality of blocks.

For example, the failure writing section 33 may include therein a page detecting section 61, a logical AND circuit 62, and a logical OR circuit 63. The page detecting section 61 receives the test target page number which is output from the testing section 20. The page detecting section 61 outputs the H logic when receiving the smallest page number in the test target block (for example, all "0"), and outputs the L logic when receiving the page number other than the smallest page number.

The logical AND circuit 62 receives the logic value of the flag which is stored on the flag memory 31 at the address identified by the position of the test target column and the logic value which is obtained by inverting the value output from the page detecting section 61, performs a logical AND operation on the received logic values, and outputs a logic value obtained as a result of the logical AND operation. The logic value output from the logical AND circuit 62 indicates the H logic when the test target page number indicates a page other than the page with the smallest page number and the logic value stored on the flag memory 31 indicates the H logic. The logic value output from the logical AND circuit 62 indicates the L logic when the test target page number indicates the page with the smallest page number, and when the test target page number does not indicate the page with the smallest page number and the logical value stored on the flag memory 31 indicates the L logic.

The logical OR circuit 63 receives the logic value indicating the test result of the test target column in the test target page of the test target block and the logic value output from the logical AND circuit 62, performs a logical OR operation on the received logic values, and outputs a logic value indicating the result of the logical OR operation. The logic value output from the logical OR circuit 63 indicates the H logic, when the test result of the test target column indicates the H logic, or when the logic value output from the logical AND circuit 62 indicates the H logic. The logic value output from the logical OR circuit 63 indicates the L logic when the test result of the test target column indicates the L logic and the logic value output from the logical AND circuit 62 indicates the L logic. The logical OR circuit 63 writes the logic value output therefrom into the flag memory 31 at the address which is identified by the position of the test target column position.

With the above-described configuration, under the condition that the failure writing section 33 has received the test result of the test target column of the page with the smallest page number in the test target block, the failure writing section 33 can write the flag indicating the received test result into the flag memory 31 irrespective of the value which has been stored on the flag memory 31, to initialize the flag memory 31. After the initialization, the failure writing section

33 can write a flag indicating that the test target column is defective into the flag memory 31, when at least one of the following conditions is satisfied: the test result of the test target column in the test target block is defective; and the flag which is stored on the flag memory 31 in association with the test target column indicates that the test target column is defective. With such a configuration, when the test target column in the test target block has a defect in one of the pages, the failure writing section 33 can write, into the flag memory 31, a flag indicating that the test target column is defective.

For example, the counting section 34 may include therein an edge detecting section 64 and an adding circuit 65. The edge detecting section 64 receives the test result of the test target column and the logic value output from the logical AND circuit 62. When the test result of the test target column indicates the H logic and the logic value output from the logical AND circuit 62 indicates the L logic, the edge detecting section 64 outputs a value "1". In the other cases, the edge detecting section 64 outputs a value "0". Which is to say, the output signal from the edge detecting section 64 reaches the value "1" at a timing when the test result of the test target column in the test target block first indicates the test target column is defective, and indicates the value "0" at the other timings.

The adding circuit 65 receives the data value which is stored on the counter memory 32 at the address identified by the test target column position and the output value from the edge detecting section 64, adds together the received values, and outputs the resulting value. Here, the data value stored on the counter memory 32 indicates the number of defective blocks. In view of this, when the output value from the edge detecting section 64 is "1", the number of defective blocks is incremented through the adding circuit 65.

The adding circuit 65 writes the result of the addition onto the counter memory 32 at the address identified by the test target column position. With such a configuration, under the condition that the test result of the test target column indicates that the test target column is defective and a flag indicating that the test target column is defective is not stored on the flag memory 31 in association with the test target column, the counting section 34 can increment the number of blocks which is stored on the counter memory 32 in association with the test target column.

As an alternative to the above-described embodiment, the flag memory 31 may have storage regions provided in a one-to-one correspondence with the plurality of blocks, and store the flags associated with the columns of a particular block in the storage region corresponding to the particular block. In this case, the failure writing section 33 writes the flag indicating that the test target column of the test target block is defective into the flag memory 31 at the address identified by the test target column position and the test target block position. Also, the failure writing section 33 reads the flag stored on the flag memory 31 from the address on the flag memory 31 which is identified by the test target block position and the test target column position.

Having the flag memory 31 configured in the above-described manner, the number of defective blocks calculating section 30 can store thereon a data value indicating the number of defective blocks in association with each column provided in the memory under test 100, even when the testing section 20 does not output the test results of the blocks block by block in the order.

FIG. 7 illustrates an exemplary configuration of the memory under test 100 which is tested by a first modification example of the test apparatus 10 relating to the present embodiment. The first modification example of the test apparatus 10 may test the memory under test 100 having therein a plurality of repairing columns each of which can replace one of the bit positions of the I/Os. As a result of the column repairing operation, each repairing column collectively replaces the storage cells which are respectively included in the columns each of which is included in one of the pages of the blocks and is associated with the same column position, where the storage cells are associated with a predetermined bit position among the I/Os of the respective columns.

Figure 8:
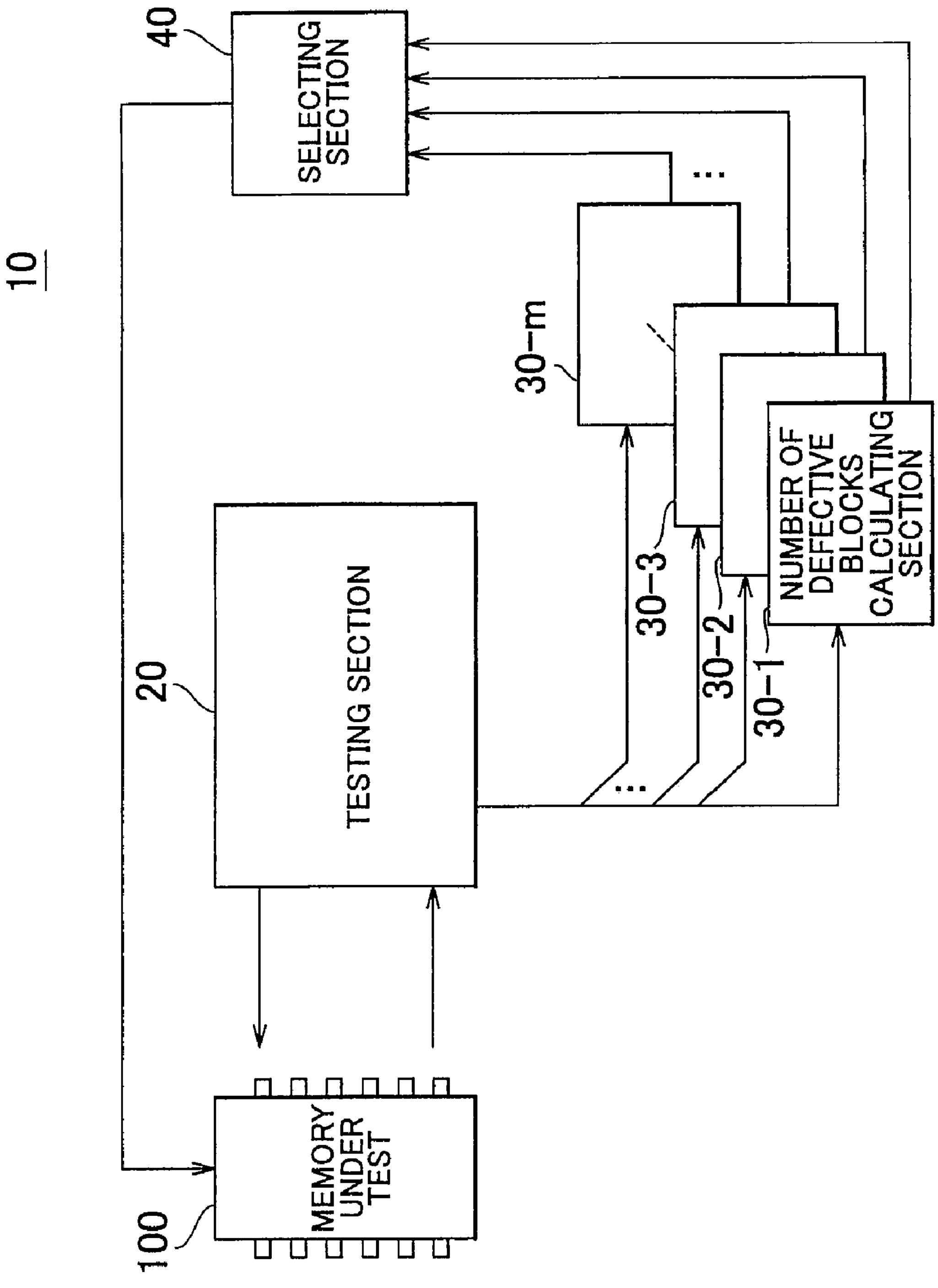
FIG. 8 illustrates the configuration of a first modification example of the test apparatus 10 relating to the embodiment of the present invention, together with the memory under test 100.

FIG. 8 illustrates the configuration of the test apparatus 10 relating to the first modification example of the present embodiment which tests the memory under test 100 illustrated in FIG. 7, together with the memory under test 100. The constituents of the test apparatus 10 relating to the present modification example have substantially the same configurations and functions as the corresponding constituents in FIG. 1 which are assigned the same reference numerals. Therefore, the following description of the test apparatus 10 is made with focus on the difference between the embodiment and the first modification example.

The testing section 20 relating to the present modification example outputs, as the test results, failure information indicating whether the respective bit positions of the I/Os of each column are defective. The test apparatus 10 includes therein a plurality of number of defective blocks calculating sections 30 (30-1 to 30-*m*, herein m indicates the number of bits of the I/Os) in association with the respective bit positions of the I/Os. Each number of defective blocks calculating section 30 obtains a test result of a corresponding bit position, from the test results output from the testing section 20, and calculates the number of defective blocks based on the obtained test result.

The selecting section 40 obtains the numbers of defective blocks from the respective number of defective blocks calculating sections 30 (30-1 to 30-*m*), and selects the columns to be replaced with the repairing columns in units of the bit positions of the I/Os. According to the above-described modification example, the test apparatus 10 can select the storage cells in units of the bit positions of the I/Os when selecting the columns to be replaced with the repairing columns.

Figure 9:
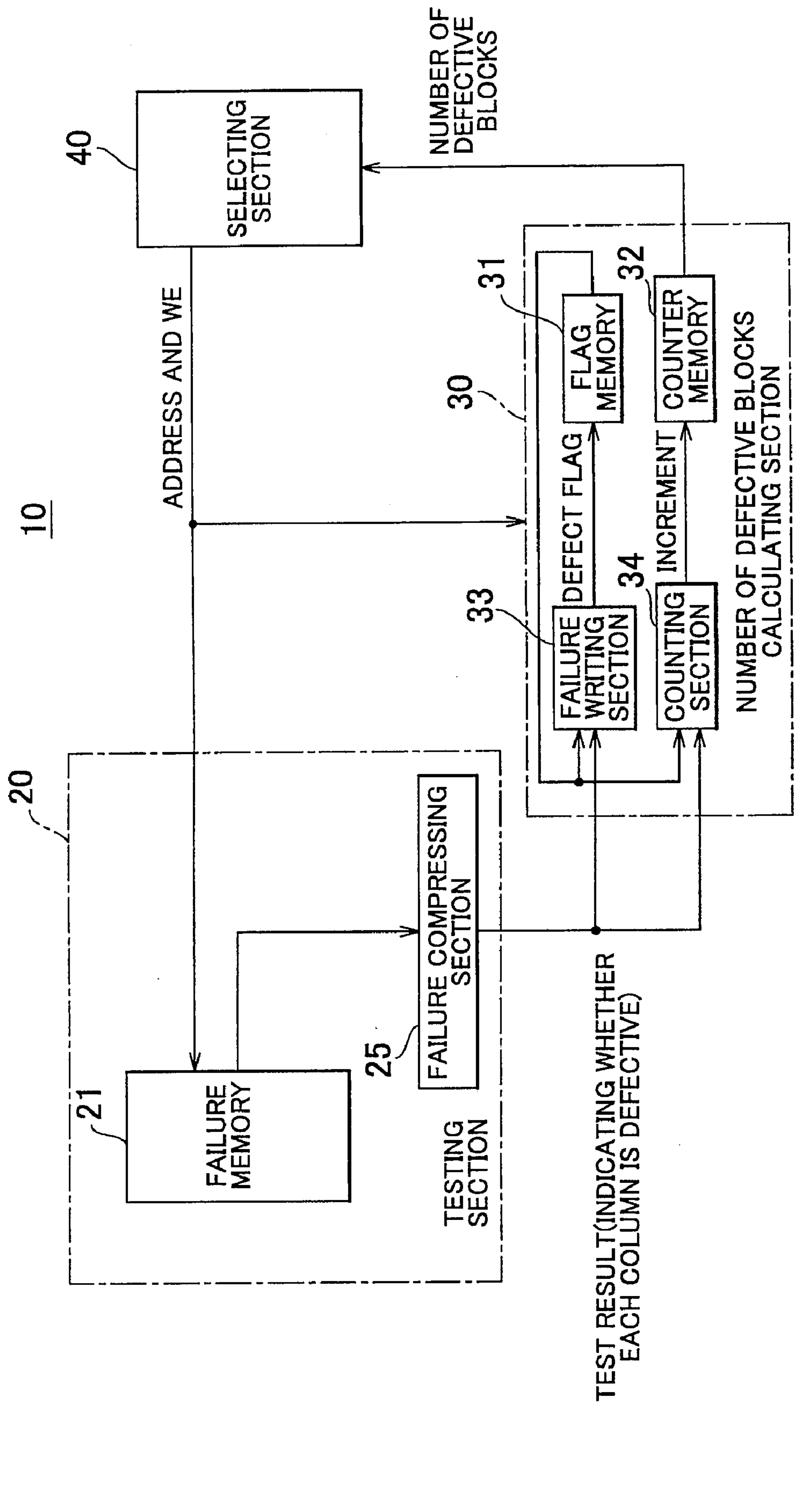
FIG. 9 illustrates the configuration of a second modification example of the test apparatus 10 relating to the embodiment of the present invention, together with the memory under test 100.

FIG. 9 illustrates the configuration of a second modification of the test apparatus 10 relating to the present embodiment, together with the memory under test 100. The constituents of the test apparatus 10 relating to the present modification example have substantially the same configurations and functions as the corresponding constituents in FIG. 1 which are assigned the same reference numerals. Therefore, the following description is made with focus on the difference between the embodiment and the second modification example.

The selecting section 40 outputs a read instruction and an address to the failure memory 21, to sequentially read the test result indicating whether each column is defective. Here, this test result is the final form of the test result stored on the failure memory 21. The failure compressing section 25 compresses the failure information which is output from the failure memory 21 and each bit of which indicates whether a corresponding storage cell is defective, into flags each of which indicates whether a corresponding column is defective. This compression is achieved, for example, by performing a logical OR operation. The failure compressing section 25 outputs the flags as the test results. The number of defective blocks calculating section 30 calculates the number of defective blocks based on the test results output from the failure compressing section 25 and the addresses output from the selecting section 40. With the above-described configuration, the number of defective blocks calculating section 30 can calculate the number of defective blocks in association with each of the columns provided in the memory under test 100 based on the final form of the test results which is stored on the failure memory 21.

While an aspect of the present invention has been described through an embodiment, the technical scope of the invention is not limited to the above described embodiment. It is apparent to persons skilled in the art that various alternations and improvements can be added to the above-described embodiment. It is also apparent from the scope of the claims that the embodiments added with such alternations or improvements can be included in the technical scope of the invention.

What is claimed is:

1. A test apparatus for testing a memory under test, the memory under test including therein (i) a plurality of blocks each of which has a plurality of columns and (ii) one or more repairing columns each of which is provided so as to collectively replace columns each of which is included in one of the plurality of blocks and associated with the same column position, the test apparatus comprising:

a testing section that tests each of the plurality of blocks provided in the memory under test, and outputs information indicating whether a test target block is defective in units of the columns;

a flag memory that stores thereon, in association with each of the plurality of columns in the test target block, a flag that indicates whether a corresponding one of the plurality of columns in the test target block is defective;

a counter memory that stores thereon, in association with each of the plurality of columns, the number of defective blocks which is the number of blocks that have defects at a column position associated with a corresponding one of the plurality of columns;

a failure writing section that receives, from the testing section, a test result of a test target column in the test target block, and writes a flag indicating that the test target column is defective into the flag memory under a condition that at least one of the following conditions is satisfied: when the received test result indicates that the test target column is defective; and when a flag that is stored on the flag memory in association with the test target column indicates that the test target column is defective;

a counting section that receives, from the testing section, the test result of the test target column, and increments the number of defective blocks which is stored on the counter memory in association with the test target column under a condition that the received test result indicates that the test target column is defective and the flag indicating that the test target column is defective is not stored on the flag memory in association with the test target column; and a selecting section that selects columns to be replaced with the repairing columns based on the number of defective blocks which is stored on the counter memory in association with each of the plurality of columns.

2. The test apparatus as set forth in claim 1, wherein each of the plurality of blocks includes a plurality of pages, and the testing section tests each of the plurality of pages, and outputs information indicating whether each of the plurality of pages is defective in units of the columns, and under a condition that the failure writing section receives a test result of a test target column that is included in an initial test target page in the test target block, the failure writing section writes the flag indicating the received test result into the flag memory.

3. The test apparatus as set forth in claim 2, wherein the testing section sequentially tests the plurality of blocks one by one, and outputs the information indicating whether each of the plurality of columns in the test target block is defective, and the flag memory stores, on a storage region common to the plurality of blocks, the flag that is associated with each of the plurality of columns in the test target block.

4. The test apparatus as set forth in claim 2, wherein the flag memory has a plurality of storage regions which are respectively provided for the plurality of blocks, and stores the flag that is associated with each of the plurality of columns in the test target block in a storage region corresponding to the test target block.

5. The test apparatus as set forth in claim 2, wherein when testing each of the plurality of blocks, the testing section sequentially tests the plurality of pages of the each block starting from a page with a smallest page number, and under a condition that the failure writing section receives a test result of a test target column that is included in a page with a smallest page number in the test target block, the failure writing section writes the flag indicating the received test result into the flag memory.

6. The test apparatus as set forth in claim 1, wherein when selecting the columns to be replaced with the repairing columns, the selecting section gives priority to a column corresponding to a column position which is associated with a larger number of defective blocks.

7. A selection apparatus for use with a memory under test, the memory under test including therein (i) a plurality of blocks each of which has a plurality of columns and (ii) one or more repairing columns each of which is provided so as to collectively replace columns each of which is included in one of the plurality of blocks and associated with the same column position, the selection apparatus selecting one or more column positions associated with the columns to be replaced with the repairing columns, the selection apparatus comprising:

a flag memory that stores thereon, in association with each of the plurality of columns in a test target block which is tested, a flag indicating whether the each column in the test target block is defective;

a counter memory that stores thereon, in association with each of the plurality of columns, the number of defective blocks which is the number of blocks that have defects at a column position associated with the each column;

a failure writing section that receives a test result of a test target column of the test target block, and writes a flag indicating that the test target column is defective into the flag memory under a condition that at least one of the following conditions is satisfied:

the received test result indicates that the test target column is defective; and a flag that is stored on the flag memory in association with the test target column indicates that the test target column is defective;

a counting section that receives the test result of the test target column, and increments the number of defective blocks which is stored on the counter memory in association with the test target column under a condition that the received test result indicates that the test target column is defective and the flag indicating that the test target column is defective is not stored on the flag memory in association with the test target column; and a selecting section that selects the columns to be replaced with the repairing columns based on the number of defective blocks which is stored on the counter memory in association with each of the plurality of columns.

8. The selection apparatus as set forth in claim 7, wherein when selecting the columns to be replaced with the repairing columns, the selecting section gives priority to columns corresponding to a column position which is associated with a larger number of defective blocks.

9. A test apparatus for testing a memory under test which is a flash memory, the memory under test including therein (i) a storage region that is divided into a plurality of blocks and (ii) a plurality of repairing lines for a repairing operation, the test apparatus using a result of the test to conduct an analysis for the repairing operation, the test apparatus comprising:

a testing section that supplies a test signal to the memory under test, and outputs, as failure information, a result of comparing read data which is output from the memory under test in response to the test signal with an expected value; and an analyzing section that generates analysis information for the repairing operation while the testing section tests the memory under test, wherein the analyzing section includes:

a flag memory that stores thereon, in response to an address signal corresponding to an address on the memory under test which is accessed by the testing section, flag information which is obtained by accumulating pieces of failure information output from the testing section, in association with each of memory regions which are obtained by dividing the plurality of blocks in the memory under test in correspondence with the plurality of repairing lines; and a counter memory that stores thereon, in response to the address signal corresponding to the address on the memory under test which is accessed by the testing section, a result of counting the number of the pieces of failure information output from the testing section, in association with each of the plurality of repairing lines provided in the memory under test.

* * * * *